(12) United States Patent
Yasukouchi

(10) Patent No.: US 7,012,411 B2
(45) Date of Patent: Mar. 14, 2006

(54) SWITCHING REGULATOR CONTROL CIRCUIT, SWITCHING REGULATOR AND SWITCHING REGULATOR CONTROL METHOD

(75) Inventor: Katsuyuki Yasukouchi, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/948,644

(22) Filed: Sep. 24, 2004

(65) Prior Publication Data

US 2005/0212499 A1   Sep. 29, 2005

(30) Foreign Application Priority Data

Mar. 29, 2004   (JP)   ............... 2004-096511

(51) Int. Cl.
*G05F 1/44* (2006.01)

(52) U.S. Cl. .................................. 323/282

(58) Field of Classification Search ............... 323/265, 323/282, 284, 349, 351
See application file for complete search history.

(56) References Cited

U.S. PATENT DOCUMENTS

| | | | | |
|---|---|---|---|---|
| 5,838,193 A * | 11/1998 | Myers et al. | ................. | 330/10 |
| 6,075,351 A * | 6/2000 | Benes | ................. | 323/280 |
| 6,127,815 A | 10/2000 | Wilcox | | |
| 6,181,120 B1 * | 1/2001 | Hawkes et al. | ............. | 323/282 |
| 6,636,025 B1 * | 10/2003 | Irissou | ................. | 323/313 |
| 6,765,374 B1 * | 7/2004 | Yang et al. | ................ | 323/280 |

* cited by examiner

*Primary Examiner*—Gary L Laxton
(74) *Attorney, Agent, or Firm*—Arent Fox, PLLC

(57) ABSTRACT

Provides a switching regulator control circuit, a switching regulator and a switching regulator control method for achieving low current consumption and quick response at normal operating time. A change-over switch MFB for opening/closing the phase compensation is provided to establish both the quick responsibility using a gain of an error amplifier EA provided with no phase compensation and stability of control system provided with phase compensation. By turning the change-over switch MFB non-conductive at a timing in which the PMOS transistor M1 turns to conductive, the phase compensation between the input and output of the error amplifier EA is cut off. A detection voltage VM is amplified in term of error with a gain of the error amplifier EA itself. A quick transient response to changes in the output voltage VOUT is achieved corresponding to maximum response characteristic. Phase compensation between the input and output of the error amplifier EA is formed by turning the change-over switch MFB conductive at a timing in which the PMOS transistor M1 turns to non-conductive. Consequently, stability of the control system can be secured.

13 Claims, 5 Drawing Sheets

CIRCUIT DIAGRAM OF EMBODIMENT

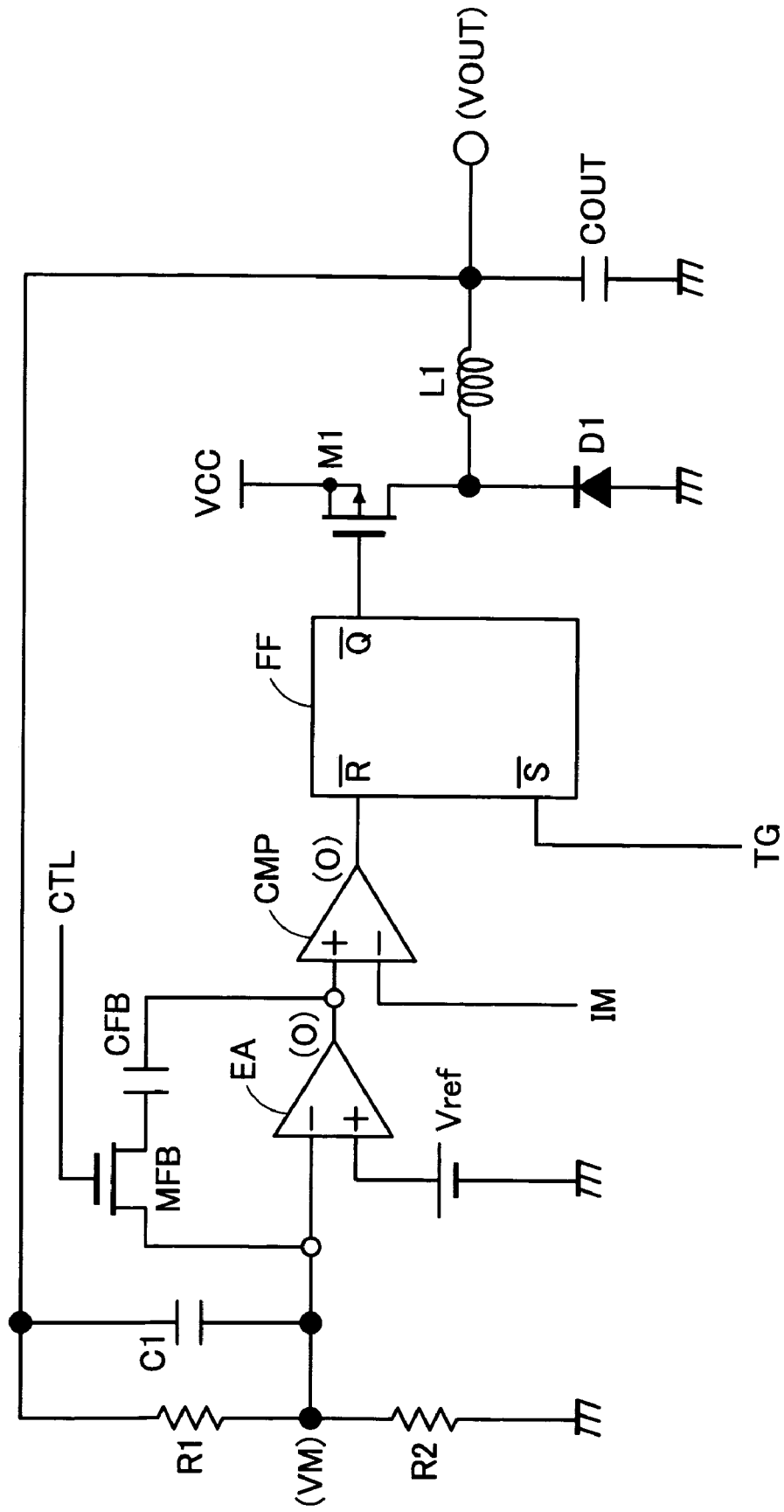
FIG.1 CIRCUIT DIAGRAM OF EMBODIMENT

CIRCUIT DIAGRAM OF MODIFICATION FOR PHASE COMPENSATION SECTION IN CASE CAPACITANCE OF CAPACITOR DEVICE IS CHANGED

CIRCUIT DIAGRAM OF MODIFICATION FOR PHASE COMPENSATION SECTION IN CASE RESISTOR DEVICE IS BYPASSED

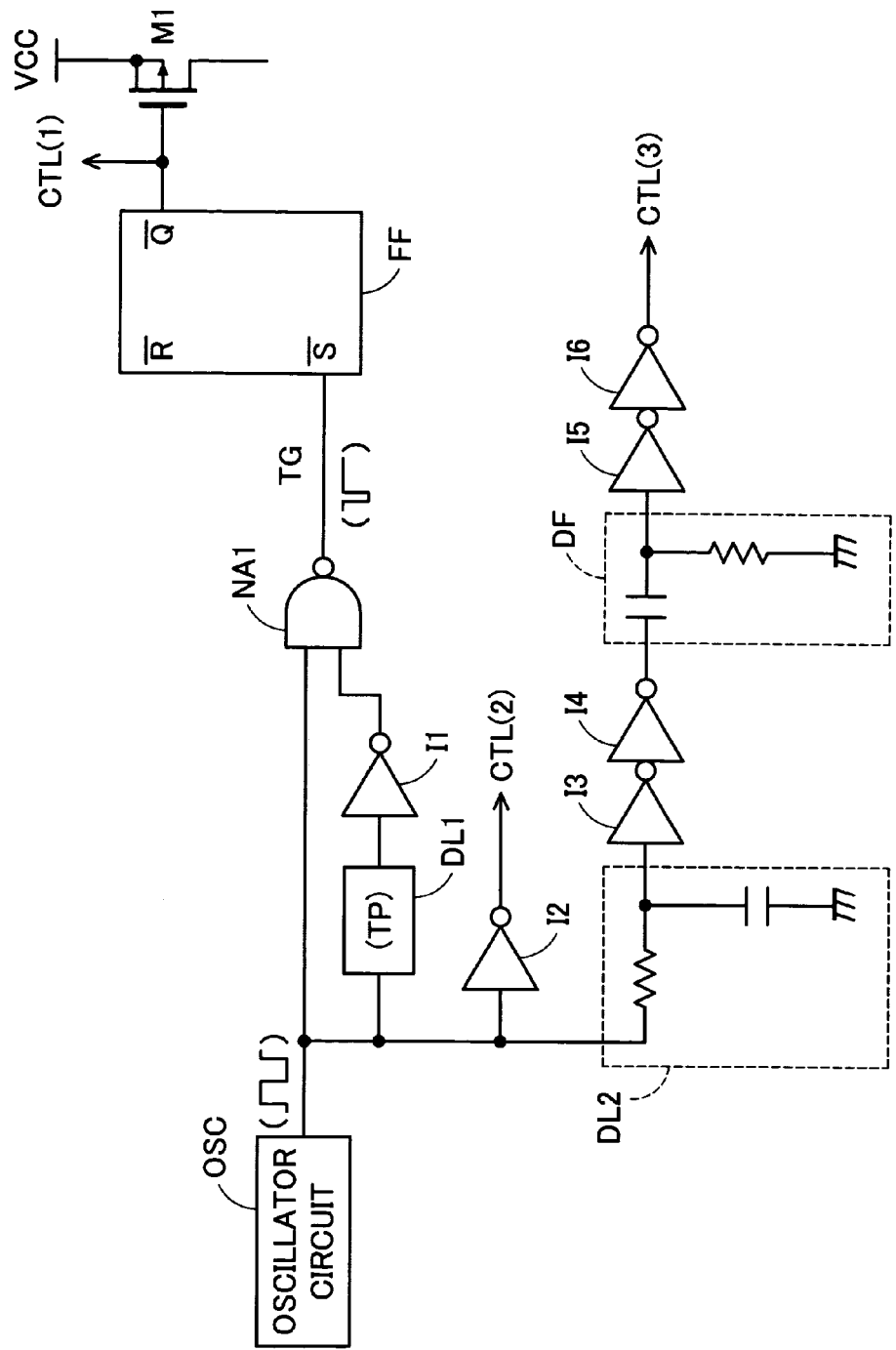
FIG.3 MAIN-PART CIRCUIT DIAGRAM SHOWING GENERATING SECTION OF USABLE SWITCH SIGNAL (CTL)

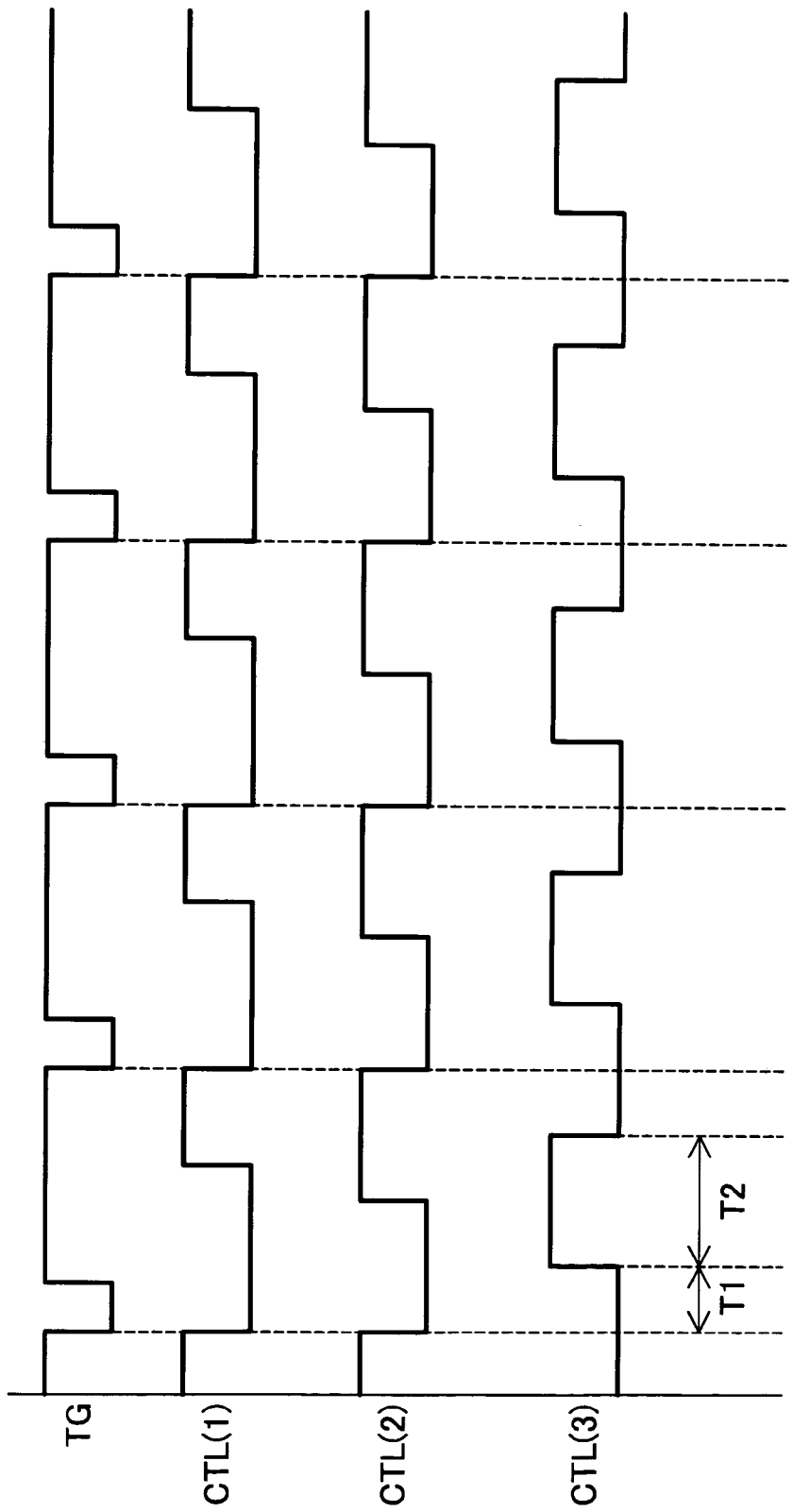

CIRCUIT DIAGRAM OF CONVENTIONAL SWITCHING REGULATOR

SWITCHING REGULATOR CONTROL CIRCUIT, SWITCHING REGULATOR AND SWITCHING REGULATOR CONTROL METHOD

CROSS-REFERENCE TO RELATED APPLICATIONS

This application is based upon and claims the benefit of priority from each of the prior Japanese Patent Application No. 2004-096511 filed on Mar. 29, 2004, the entire contents of which are incorporated herein by reference.

BACKGROUND OF THE INVENTION

1. Field of the Invention

The present invention relates to a switching regulator and more particularly to a switching regulator having an excellent quick response to a deflection in output voltage despite a low current consumption.

2. Description of Related Art

The switching regulator disclosed in U.S. Pat. No. 6,127,815 aims at reducing a current consumption to be consumed in a control circuit in a suspending period in which no load current is consumed. In a switching regulator 200 shown in FIG. 5, a sleep signal outputted from a comparator 128 controls a switch 127. Further, a sleep signal is connected to a power saving enable terminal 223 of an error amplifier 222 so as to switch the control state of the error amplifier 222 between normal operating period and the suspending period which is a power saving operating condition.

In normal operating period for supplying a large load current, the switch 127 is connected to an A side with the sleep signal and the filter circuit 225 is connected to the output terminal of an error amplifier 222. The voltage of an output signal ITH is kept over a threshold voltage V1 and the sleep signal is kept on a low level so that the switching timing circuit 101 and comparator 102 are activated. Further, the error amplifier 222 is kept in activate condition capable of securing a sufficient quick response speed in the normal operating period.

In the suspending period, the load current is reduced and the voltage of the signal ITH drops below the threshold voltage V1, so that the sleep signal is inverted to a high level. The switching timing circuit 101 and the comparator 102 turn to inactive condition, and the error amplifier 222 not requiring the quick response turns to power saving operating condition. Further, the switch 127 is connected to B side, so that the filter circuit 225 is separated from the output terminal of the error amplifier 222. Consequently, power consumption is reduced.

SUMMARY OF THE INVENTION

According to the U.S. Pat. No. 6,127,815, in the suspending period in which no load current flows, the switching timing circuit 101 and the comparator 102 turn to inactivate condition and the error amplifier 222 turns to power saving operating condition, in order to reduce current consumption in the switching regulator control circuit.

However, in the normal operating condition, the switching timing circuit 101 and the comparator 102 are activated and the error amplifier 222 is in normal operating condition in order to secure quick response to changes in load current. Further, the filter circuit 225 is connected to the output terminal of the error amplifier 222. Consequently, current consumption increases due to activation of the switching timing circuit 101 and the comparator 102, and the output terminal which the filter circuit 225 is connected is driven at high speeds. So, bias current and the like of the error amplifier 222 are intensified so that current consumption increases. In the normal operating condition, the current consumption of the switching regulator control circuit increases in order to secure the quick response.

Conversely, in order to reduce the current consumption of the switching regulator control circuit in the normal operating condition, the drive performance of the error amplifier 222 needs to be controlled. In this case, changes in the load current cannot be followed up, which is a problem to be solved.

Accordingly, the present invention has been accomplished to solve the above-described problems of the conventional technology and intends to provide a switching regulator control circuit, a switching regulator and switching regulator control method capable of achieving quick response to change in output voltage while maintaining low current consumption property of a suspending period even in normal operating condition.

To achieve the above object, according to an aspect of the present invention, there is provided a switching regulator control circuit for a switching regulator for controlling an output voltage by repeating supply of electric power corresponding to ON/OFF of a switch device, comprising an error amplifier for amplifying a voltage difference between the output voltage and desired voltage, and a phase compensation section which is connected in between the input and output of the error amplifier so as to stabilize the operating condition of a control system, the switching regulator further comprising: a phase compensation quantity switching section for reducing the phase compensation quantity of the phase compensation section in a predetermined period containing a timing in which conduction of the switch device is started.

Further, according to another aspect of the present invention, there is provided a switching regulator comprising an error amplifier for amplifying a voltage difference between the output voltage and desired voltage, and a phase compensation section which is connected in between the input and output of the error amplifier so as to stabilize the operating condition of a control system, the switching regulator further comprising: a phase compensation quantity switching section for reducing the phase compensation quantity of the phase compensation section in a predetermined period containing a timing in which conduction of the switch device is started.

According to still another aspect of the present invention, there is provided a switching regulator control method in which a voltage difference between the output voltage and desired voltage is amplified in terms of error and an output voltage is negatively fed back so as to stabilize the operating condition of the control system, the switching regulator control method comprising a step of reducing the phase compensation quantity of the phase compensation in a predetermined period containing a timing in which the conduction of the switch device is started.

According to the switching regulator control circuit, the switching regulator and the switching regulator control method of the present invention, the phase compensation quantity in the phase compensation of the error amplifier for achieving stabilization of the operating condition of the control system is changed over. The phase compensation quantity of the phase compensation is reduced in a predetermined period containing a timing in which conduction of the switch device is started. Here, the reduction means that the value of the phase compensation quantity decreases and includes a case where the feedback loop is cut off so that the phase compensation quantity becomes zero.

Consequently, the phase compensation quantity of the phase compensation is decreased in the predetermined period at least partially containing a period in which the error amplifier controls the conductive condition of the switch device. Thus, no response suppressing operation of the error amplification occurs to a voltage difference between the output voltage and the desired voltage, so that a response with a large gain can be generated to the error amplification. The output voltage can be brought near the desired voltage steeply. Even if the output voltage drops due to an increase in the load current or the like at normal operation time, a quick transient response characteristic can be obtained without increasing current consumption in a control circuit of an error amplifier or the like.

Because the phase compensation quantity of the phase compensation increases in a period containing the non-conductive condition of the switch device, response of error amplification to the voltage difference between the output voltage and desired voltage is suppressed. A deflection in the error amplifying voltage amplified in terms of error to a deflection in the output voltage is suppressed, so that the error amplifying voltage is never deflected in a next electric power supply cycle in which the quantity of electric power supply to the output increases. Consequently, continuity of the error amplifying voltage can be maintained in a period between an end time and a start time of adjacent electric power supply cycles, thereby achieving a smooth output voltage control.

A quick transient response can be provided in the switching regulation operation despite a low current consumption operation.

The above and further objects and novel features of the invention will more fully appear from the following detailed description when the same is read in connection with the accompanying drawings. It is to be expressly understood, however, the drawings are for the purpose of illustration only and are not intended as a definition of the limits of the invention.

BRIEF DESCRIPTION OF THE DRAWINGS

FIG. 1 is a circuit diagram of an embodiment;

FIG. 3 is a main-part circuit diagram showing generating section of a usable switch signal (CTL);

FIG. 4 is a timing chart of a usable switch signal; and

DETAILED DESCRIPTION OF THE PREFERRED EMBODIMENTS

Figure 2A:
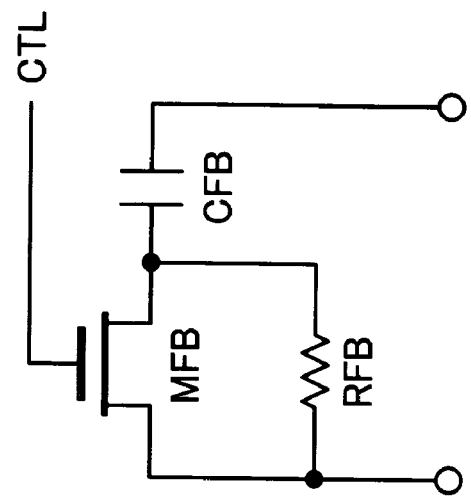
FIG. 2A is a circuit diagram of a modification for a phase compensation section, wherein capacitance of a capacitor device is changed.

Hereinafter, the preferred embodiments of the switching regulator control circuit, switching regulator and switching regulator control method of the present invention will be described in detail with reference to FIGS. 1–4.

FIG. 1 shows a step-down switching regulator of the embodiment of the present invention. A load (not shown) is connected to the output terminal (VOUT) and an output capacitor device COUT is connected for supplying charges to the load. Further, resistor devices R1, R2 are connected in series toward a ground potential so as to detect the output voltage VOUT. Further, a capacitor device C1 for phase compensation is connected in parallel to the resistor device R1.

A connection point (VM) of the resistor devices R1, R2 is a detection point for the output voltage VOUT and connected to an inversion input terminal (−) of the error amplifier EA. A reference voltage Vref is connected to a non-inversion input terminal (+) of the error amplifier EA. The output terminal (O) of the error amplifier EA is connected to the non-inversion input terminal (+) of a comparator CMP on a next stage. A current monitor signal IM is inputted to the inversion input terminal (−) of the comparator CMP. The current monitor signal IM is a detection signal for a current inputted from the power voltage VCC to an inductor L1.

Phase compensation is formed from the output terminal (O) of the error amplifier EA to the inversion input terminal (−) The phase compensation is connected to the inversion input terminal (−) of the error amplifier EA or the connection point (VM) of the resistor devices R1, R2, which are detection points for the output voltage VOUT, through a capacitor feedback device CFB and a change-over switch MFB for opening/closing the feedback loop via the capacitor feedback device CFB. The opening/closing of the change-over switch MFB is controlled with a control signal CTL as described in FIGS. 3, 4.

The output terminal (O) of the comparator CMP is connected to a reset terminal (/R) of a flip-flop circuit FF. The content of the flip-flop circuit FF is reset with a low level signal. A trigger signal TG is inputted to a set terminal (/S) of the flip-flop circuit FF. The content of the flip-flop circuit FF is set depending on the input of the low-level trigger signal TG and a low level output signal is outputted from the output terminal (/Q).

The output terminal (/Q) of the flip-flop circuit FF is connected to the gate terminal of a PMOS transistor M1. In the PMOS transistor M1, its source terminal is connected to the power voltage VCC and its drain terminal is connected to a terminal of an inductor L1. A cathode terminal of a diode device D1, whose anode terminal is connected to the ground voltage, is connected to the terminal of the inductor L1. The other terminal of the inductor L1 is connected to the output terminal (VOUT).

The switching regulator of the embodiment having the above-described connection is a step-down switching regulator which performs switching control on current mode.

If the PMOS transistor M1 turns conductive and the terminal of the inductor L1 is connected to the power voltage VCC, a larger voltage than the output voltage VOUT on the other terminal is applied to the terminal so that current flowing into the inductor L1 increases with a predetermined time gradient determined by a voltage difference between terminals and an inductance value. Electromagnetic energy accumulated in the inductor L1 increases and at the same time, electric power is supplied to the output capacitor device COUT and the load (not shown). If the PMOS transistor M1 turns non-conductive, due to necessity of continuity with electromagnetic energy of the inductor L1 accumulated up to then, current continues to flow to the inductor L1 maintaining continuity of current value with a current just before turning non-conductive. Because this current is supplied through the diode D1, the terminal of the inductor L1 becomes substantially equal to the ground potential so that a lower voltage is applied with respect to the other terminal of the output voltage VOUT. Consequently, current decreases with a negative time gradient. Electromagnetic energy accumulated in the inductor L1 is discharged to the output capacitor device COUT and the load with a current flowing through the diode D1.

To maintain the output voltage VOUT at a predetermined voltage value while supplying electric power to the output capacitor device COUT and the load, the output voltage VOUT is detected at the connection point (VM) to adjust timing of conductive/non-conductive of the PMOS transistor M1. Consequently, the output voltage VOUT becomes equal to a desired voltage in a condition in which the detection voltage VM at the connection point (VM) coincides with the reference voltage Vref. In the switching regulator, the output voltage VOUT is always fed back and controlled based on the reference voltage Vref, so that it is regulated to an output voltage VOUT based on the desired voltage.

If the flip-flop circuit FF is set with a low level trigger signal TG and a low level signal is outputted from the /Q output terminal, the PMOS transistor M1 starts its conductivity. A detection voltage VM gained by the connection point (VM) of the resistor devices R1, R2 is inputted to the error amplifier EA and a voltage difference of the detection voltage VM from the reference voltage Vref is amplified in terms of error so as to output error amplified voltage VEA. As for the error amplified voltage VEA, if the detection voltage VM is lower than the reference voltage Vref, a higher voltage is outputted corresponding to the degree of that shortage. When the error amplified voltage VEA is compared with the current monitor signal IM and then the current monitor signal IM exceeds the error amplified voltage VEA, the comparator CMP outputs a low level reset signal. Consequently, the flip-flop circuit FF is reset and a high-level signal is outputted from the /Q output terminal, the PMOS transistor M1 turns non-conductive.

The non-conduction timing of the PMOS transistor M1 is determined at a timing in which the current monitor signal IM reaches a voltage level of the error amplified voltage VEA. Because the PMOS transistor M1 turns non-conductive at this timing, the peak current value inputted to the inductor L1 through the PMOS transistor M1 is determined depending on the degree of shortage of the output voltage VOUT to the desired voltage. That is, if the short amount of the output voltage VOUT from the desired voltage is slight, the voltage difference between the detection voltage VM and the reference voltage Vref is slight also, so that the voltage level of the error amplified voltage gained by amplifying this voltage difference lowers also. Corresponding to a small current monitor signal IM, the output voltage of the comparator CMP is inverted to a low level so that the PMOS transistor M1 turns non-conductive. A peak current inputted to the inductor L1 decreases. If the output voltage VOUT drops largely from the desired voltage, the short amount of the detection voltage VM from the reference voltage Vref becomes large and the voltage level of the error amplified voltage VEA gained by amplifying this voltage difference turns to a high voltage level. Corresponding to a large current monitor signal IM, the output voltage of the comparator CMP inverts to a low level so that the PMOS transistor M1 becomes non-conductive. A peak current inputted to the inductor L1 increases.

The trigger signal TG is a pulse signal generated based on a clock signal or the like of a predetermined cycle outputted from an oscillator circuit or the like (see FIG. 3). The switching regulator on current mode is controlled by controlling the peak current inputted to the inductor L1 depending on the short amount of the output voltage VOUT for every period of the trigger signal TG.

The phase compensation achieved from the output terminal (O) of the error amplifier EA to the inversion input terminal (−) through the capacitor feedback device CFB when the change-over switch MFB composed of the NMOS transistor and the like is conductive is a circuit configuration generally adopted in a control system for executing feedback control such as a switching regulator. It is intended to suppress quick transient response to some extent by applying negative feedback from the output terminal (O) to quick changes in the detection voltage VM to the inversion input terminal (−) so as to stabilize the control system. However, because the phase compensation acts in the direction that the error amplified voltage VEA blocks a change in the detection voltage VM, an excessive negative feedback may suppress a restoration operation of the output voltage VOUT to a quick change in the output voltage VOUT. In some case, the transient responsibility cannot help being scarified in order to maintain the stability of the system.

If the quick responsibility is searched for to an extreme limit, a structure in which no phase compensation is provided between the input and output of the error amplifier EA can be considered. In this case, the voltage difference of the detection voltage VM inputted to the error amplifier EA from the reference voltage Vref can be amplified in terms of error with a gain of the error amplifier EA. However, if an error is amplified in terms of error with a large gain which is not negatively fed back, in the feedback control of a system in which the detection voltage VM is changed to the output voltage VOUT and then it returns to the detection voltage again, the control system comes to oscillate without being stabilized.

Thus, the switching regulator (FIG. 1) of this embodiment is provided with a change-over switch MFB for opening/closing the phase compensation so as to achieve both the quick responsibility using the gain of the error amplifier EA provided with no phase compensation and the phase compensation. The change-over switch MFB opens/closes the phase compensation depending on the control timing (FIG.4), which will be described later, with the control circuit (FIG. 3), which will be described later.

The change-over switch MFB is turned to non-conductive state so as to cut out the phase compensation between the input and output of the error amplifier EA, synchronously with the conduction timing of the PMOS transistor M1 (in case of CTL(1) in FIGS. 3, 4), in a predetermined period from the conduction timing (in case of CTL (2) in FIGS. 3, 4) or during a predetermined timing from a timing prior to the conduction timing up to a timing after the conduction timing (in case of CTL (3) in FIGS. 3, 4). The detection voltage VM corresponding to the output voltage VOUT is amplified in terms of error with a gain possessed by the error amplifier EA without forming the phase compensation. The acquired error amplified voltage VEA is a voltage directly reflecting the detection voltage VM from the reference voltage Vref and consequently, the peak current to the inductor L1 determined by the comparator CMP becomes a maximum current for recovering the output voltage Vref to a desired voltage. At a timing that the supply of electric power to the output terminal (VOUT) through the inductor L1 by the conduction of the PMOS transistor M1 changes to an increase, the electric power supply to the output capacitor device COUT and load is carried out depending on the maximum responsibility so that quick transient response can be achieved.

The changeover switch MFB is turned conductive so as to form phase compensation between the input and output of the error amplifier EA, synchronously with the non-conduction timing of the PMOS transistor M1 (in case of CTL (1) in FIGS. 3, 4), after a predetermined period from the conduction timing (in case of CTL (2) in FIGS. 3, 4) or during a predetermined time from a predetermined timing after conduction up to a preceding timing of a next cycle conduction timing (in case of CTL (3) in FIGS. 3, 4). A capacitor feedback device CFB is inserted into between the input and output of the error amplifier EA due to conduction of the changeover switch MFB so as to form the phase compensation. Consequently, at a timing in which the supply of current to the output terminal (VOUT) through the inductor L1 is changed to decrease due to non-conduction of the PMOS transistor M1, stability in feedback control of the control system is secured thereby preventing oscillation.

By cutting out the phase compensation from the output terminal (O) of the error amplifier EA to the inversion input terminal (−) in a period in which the electric power supply to the output terminal (VOUT) through the inductor L1 is increased, quick responsibility to a deflection in the output voltage VOUT is secured. In a period in which the electric power supply to the output terminal (VOUT) through the inductor L1 decreases, stability of the feedback control in the switching regulator can be secured by forming the phase compensation between the input and output terminal of the error amplifier EA.

Figure 2B:
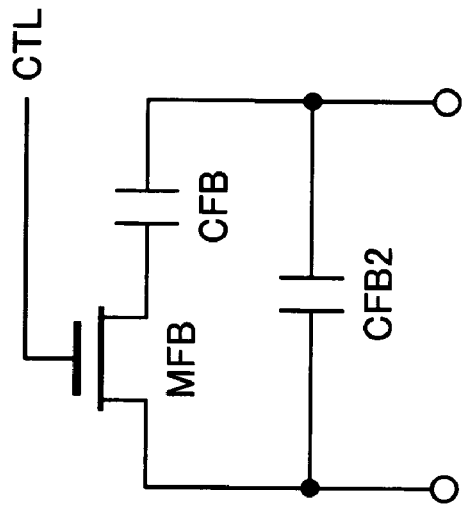
FIG. 2B is a circuit diagram of a modification for a phase compensation section, wherein resistor device is bypassed.
Figure 5:
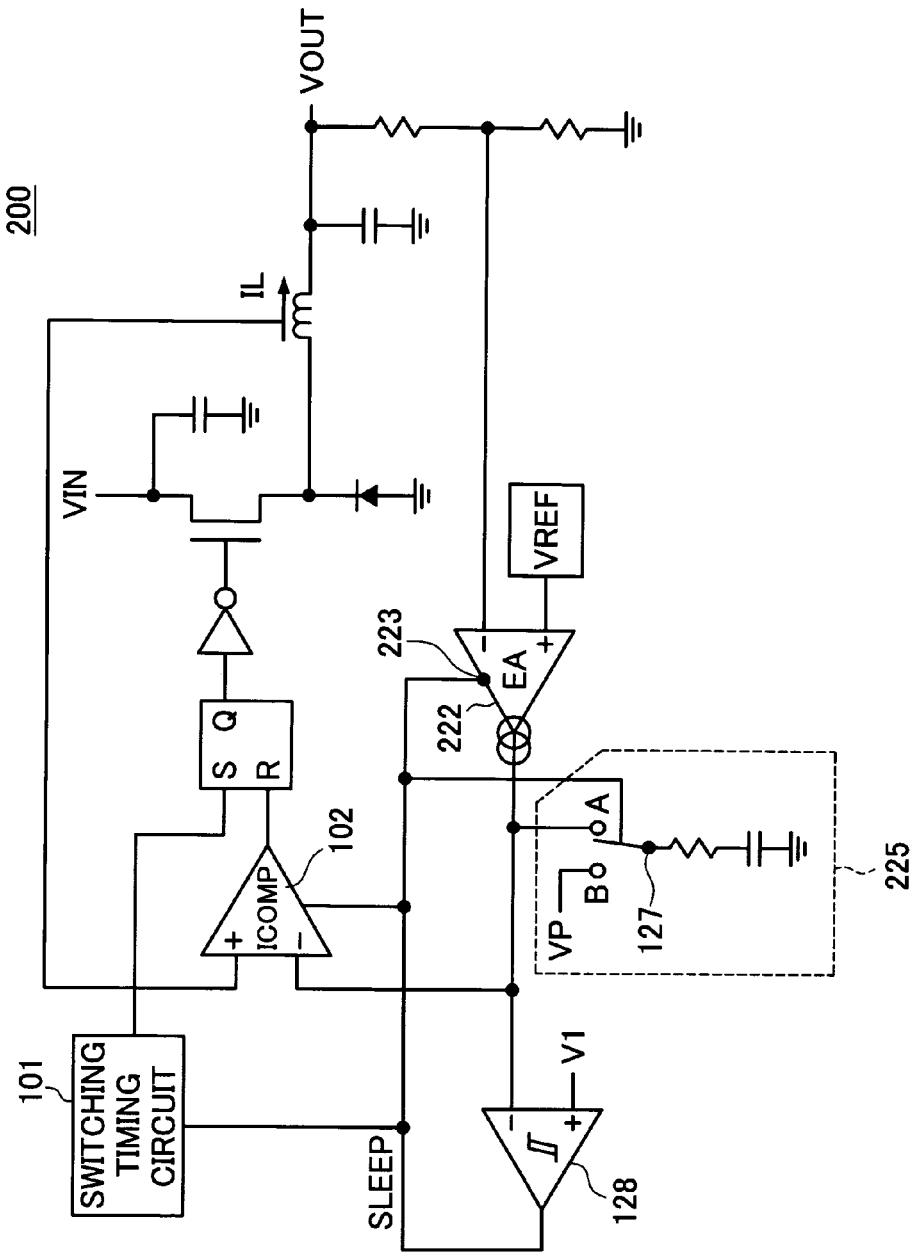
FIG. 5 is a circuit diagram of a conventional switching regulator.

FIG. 2 shows an example of modification of the phase compensation in the error amplifier EA. According to the embodiment shown in FIG. 1, the phase compensation provided with the capacitor feedback device CFB is cut at a timing in which the electric power supply to the output terminal (VOUT) increases and the phase compensation, and controls to be connected at a timing in which the electric power supply decreases. Corresponding to this, according to the example of modification shown in FIG. 2A and FIG. 2B, the capacitor feedback device CFB2 is provided in parallel to the capacitor feedback device CFB and the changeover switch MFB like FIG. 2A or a resistor feedback device RFB is provided in parallel to the change-over switch MFB like FIG. 2B. The phase compensation provided with the capacitor feedback device CFB is cut out by turning the change-over switch MFB non-conductive at a timing in which the electric power supply to the output terminal (VOUT) increases (in case of FIG. 2A) or the phase compensation quantity in a feedback loop is changed over by bypassing the resistor feedback device RFB (in case of FIG. 2B).

In case of FIG. 2A, the change-over switch MFB is kept conductive at a timing in which the electric power to the output terminal (VOUT) decreases and the capacitor feedback devices CFB and CFB2 are connected in parallel to each other so as to form the phase compensation. At the timing in which the electric power supply to the output terminal (VOUT) increases, the change-over switch MFB turns to non-conductive so that the capacitor feedback device CFB is separated from the phase compensation thereby forming the phase compensation with only the capacitor feedback device CFB2. At the timing in which the electric power supply increases, the total capacitance of the capacitor feedback device to be inserted into a loop decreases as compared to the timing in which the electric power supply decreases thereby reducing the phase compensation. Consequently, stabilized operation is realized by securing the phase compensation quantity of the phase compensation at a timing in which current decreases while the phase compensation quantity is limited at the timing in which the current increase, thereby achieving quick transient responsibility to changes in the output voltage VOUT.

In case of FIG. 2B, at the timing in which the electric power supply to the output terminal (VOUT) decreases, the change-over switch MFB turns to conductive, so that the resistor feedback device RFB is bypassed to form the phase compensation with the capacitor feedback device CFB. At the timing in which the electric power supply to the output terminal (VOUT) increases, the change-over switch MFB turns to non-conductive so that the resistor feedback device RFB is connected to the capacitor feedback device CFB thereby forming the phase compensation. Because the resistor feedback device RFB is inserted at the timing in which the electric power supply increases, the phase compensation quantity decreases as compared to the timing in which the electric power supply decreases. At the timing in which current decreases, the phase compensation quantity is secured so as to achieve stable operation and at the timing in which current increases, the phase compensation quantity is limited so as to achieve quick transient responsibility to changes in the output voltage VOUT.

FIG. 3 shows a generating portion for the control signal CTL of the change-over switch MFB, which opens/closes the phase compensation (FIG. 1) or increases/decreases the phase compensation quantity. FIG. 4 shows the operation timing waveform of the control signal CTL together with the trigger signal TG. Assume that the change-over switch MFB is constituted of, for example, a NMOS transistor and that turns to conductive with a high-level control signal CTL while turning to non-conductive with a low-level control signal CTL.

FIG. 3 is a main circuit diagram containing a flip-flop circuit FF for controlling the PMOS transistor M1. An oscillation signal outputted from the oscillator circuit OSC is inputted to an NAND gate NA1, a delay circuit DL1, an inverter gate I2 and an integrating circuit DL2. An output signal of the delay circuit DL1 is inputted to the inverter gate I1 and an output signal of the inverter gate I1 is inputted to the other input terminal of the NAND gate NA1. A trigger signal TG is outputted from the NAND gate NA1. The drive signal of the PMOS transistor M1 outputted from the /Q output terminal of the flip-flop circuit FF, which is set with the trigger signal TG and reset with the comparator CMP (FIG. 1), is the control signal CTL (1). The control signal CTL (2) is outputted from the output terminal of the inverter gate I2. The output signal of the integrating circuit DL2 is propagated to two stage inverter gates I3, I4 successively and consequently, a control signal CTL (3) is outputted by a differentiating circuit DF through two stage inverter gates I5, I6. Any one of the control signals CTL (1)–(3) can be used.

A low level pulse signal TG outputted from the NAND gate NA1 as shown in FIG. 4 is outputted under a pulse width of a delay time TP in the delay circuit DL synchronously with a rise-up edge of the oscillation signal. The flip-flop circuit FF is set with this low-level signal so that the PMOS transistor M1 turns to conductive.

The control signal CTL (1) is outputted when a conduction signal of the PMOS transistor M1 is used as it is. In a period in which the PMOS transistor M1 turns to conductive so that the electric power supply to the output terminal (VOUT) increases, the phase compensation is cut off and the phase compensation quantity is limited, so as to achieve a transient response to the output voltage VOUT accompanied with electric power supply quickly.

The control signal CTL (2) inverts the oscillation signal to form a control signal. This control signal cuts off the phase compensation or limits the phase compensation quantity synchronously with the conduction timing of the PMOS transistor M1 and at an intermediate timing of oscillation cycle of an oscillation signal, the phase compensation is connected or the phase compensation quantity is increased. The conduction rate of the PMOS transistor M1 in the oscillation cycle is determined constantly by power voltage VCC and output voltage VOUT and changes depending on a transient condition. By using the control signal (2), cutting off of the phase compensation or limitation of the phase compensation quantity is started at the same time when conduction of the PMOS transistor M1 is started and can be terminated before or after the PMOS transistor M1 turns to non-conductive. In a former half period in which the PMOS transistor M1 turns to conductive and electric power supply to the output terminal (VOUT) is started, the phase compensation is cut off and the phase compensation quantity is limited, so that transient response of the output voltage VOUT accompanied by electric power supply can be achieved quickly.

In the generation circuit of the control signal CTL (3), first by integrating an oscillation signal with the integrating circuit DL2, a signal having a transition delay corresponding to CR time constant with respect to the transition of the signal level of the oscillation signal is outputted. This signal having the transition delay is shaped in terms of waveform with the inverter gates I3, I4. Consequently, a signal having a time delay T1 determined by the CR time constant is outputted from the inverter gate I4. The signal outputted from the inverter gate I4 is inputted to the differentiating circuit DF and differentiated. A waveform generating a steep level transition with respect to the signal transition is outputted. In this differentiated waveform, the level is restored to a constant value gradually with a voltage level differentiated by the signal transition. Therefore, because this signal is inputted to the inverter gate I5, an inverted pulse signal is outputted in a period from the peak voltage at the time of signal transition to a threshold voltage of the inverter gate I5 and further, the signal level is re-inverted by the inverter gate I6. The time width of the pulse signal is set up depending on a capacitor device constituting the differentiating circuit and the value of a resistor device and a pulse signal having a time width T2 is outputted from the inverter gate I6.

At a timing of high level transition of an oscillation signal in which the trigger signal TG is outputted, a signal having the same phase is outputted from the inverter gate I4 after a delay time T1 and further, a high level signal having a pulse width T2 is outputted from the inverter gate I6. With a delay of a time T1 after a timing in which the PMOS transistor M1 turns to conductive and electric power supply to the output terminal (VOUT) is started, cutting of the phase compensation and limitation of the phase compensation quantity are started and this duration time is a time T2. By adjusting the times T1 and T2, the cutting of the feedback loop and the limitation of the phase compensation quantity are started prior to start of electric power supply to the output terminal (VOUT) and at a predetermined timing after that, the cutting of the feedback loop and the limitation of the phase compensation quantity can be terminated. In this while, transient response of the output voltage VOUT accompanied by the electric power supply can be achieved quickly.

As described in detail above, according to the switching regulator control circuit, switching regulator and switching regulator control method of this embodiment, the conduction period of the PMOS transistor M1, which is an example of the switch device is controlled by the error amplifier EA and in a predetermined period at least partially containing a period in which the quantity of electric power supplied to the output terminal (VOUT) increases, the phase compensation quantity of the phase compensation is reduced. Consequently, no response suppressing operation of error amplification occurs to a voltage difference between the output voltage VOUT and the desired voltage, so that a response with a large gain is generated to even the error amplification. Thus, even if the output voltage VOUT drops due to an increase in load current or the like at normal operation time, a quick transient response can be obtained without increasing current consumption in such a control circuit as the error amplifier EA.

Further, the non-conductive condition of the PMOS transistor M1 is maintained without control of the error amplifier EA up to a next cycle, and the phase compensation quantity of the phase compensation increases in a period in which the quantity of the electric power supply to the output terminal (VOUT) decreases. Thus, the response of error amplification to the voltage difference between the output voltage VOUT and desired voltage is suppressed. The deflection of the error amplification voltage VEA to a deflection of the output voltage VOUT is suppressed and in a next power supply cycle in which the quantity of electric power supply to the output terminal (VOUT) increases, the error amplification voltage VEA is not deflected largely. Consequently, continuity of the error amplification voltage VEA between the end time and start time of an adjacent power supply cycle can be maintained so as to control the output voltage VOUT smoothly.

The switching regulation operation may be provided with a quick transient responsibility, which is a low current consumption action.

Because the change-over switch MFB, which is an example of the phase compensation changing-over portion, cuts off the phase compensation or limits the phase compensation quantity, the gain of the error amplification can be maximized when the loop is cut off or the phase compensation quantity is limited.

The switching regulator of the embodiment is a step-down switching converter, in which the phase compensation quantity is cut off or reduced corresponding to a conduction control signal which turns the PMOS transistor M1, which is an example of the switch device, conductive. Because electric power supply to the output terminal (VOUT) increases when the PMOS transistor M1 is conductive, the phase compensation quantity is cut off or reduced corresponding to a time when the electric power supply to the output terminal (VOUT) increases.

The control signal CTL(1) for setting a predetermined period is set up synchronously with a conduction control signal. Further, the control signal CTL(2) can be terminated prior to or after the conduction control signal ends. In any case, when electric power is supplied to the output terminal (VOUT), the voltage difference between the output voltage VOUT and the desired voltage can be amplified based on a gain with a large error amplification so as to bring the output voltage near a desired voltage steeply.

The present invention is not restricted to the above-described embodiments but needless to say, may be improved or modified in various ways within a scope not departing from the gist of the present invention.

For example, although for this embodiment, a step-down switching converter has been exemplified, the present invention is not restricted to this example, but the present invention can be applied to a boosting switching converter and other type switching converters.

As for the boosting switching converter also, preferably, the phase compensation quantity is cut off or reduced corresponding to a conduction control signal which places the switch device in a conductive condition. To control the conduction time of the switch device accurately, the phase compensation quantity is cut out or reduced corresponding to the conduction control signal which places the switch device in a conductive condition.

Although for this embodiment, a current mode switching regulator has been exemplified, the present invention is not restricted to this example. Because a voltage mode switching regulator can be calibrated by inputting such an oscillation signal as triangular wave and saw-tooth-wave instead of a current monitor signal inputted to the comparator CMP in FIG. 1, the present invention can be applied to the voltage mode switching regulator also.

Although a case where the trigger signal TG is outputted at the same cycle as the oscillation signal has been described with reference to FIG. 3, the oscillation signal can be divided.

According to the present invention, it is possible to provide a switching regulator control circuit, a switching regulator and a switching regulator control method capable of achieving quick transient responsibility to changes in the output voltage without increasing consumption current of a circuit in normal operating condition, because the error amplifier reduces a phase compensation quantity of phase compensation of the same error amplifier in a period containing a period for controlling the conductive condition of the switch device, so as to amplify a voltage difference between an output voltage and desired voltage in terms of error.

What is claimed is:

1. A switching regulator control circuit for a switching regulator for controlling an output voltage by repeating supply of electric power corresponding to ON/OFF of a switch device, comprising:
   an error amplifier for amplifying a voltage difference between the output voltage and desired voltage, and
   a phase compensation section which is connected in between the input and output of the error amplifier so as to stabilize the operating condition of a control system,
   wherein the switching regulator further comprises a phase compensation quantity switching section for reducing the phase compensation quantity of the phase compensation section in a predetermined period containing a timing in which conduction of the switch device is started.

2. The switching regulator control circuit according to claim 1, wherein the phase compensation quantity switching section reduces the phase compensation quantity by cutting off a compensation pass in the phase compensation section.

3. The switching regulator control circuit according to claim 1, wherein the predetermined period is set up corresponding to a conduction control signal of the switch device.

4. The switching regulator control circuit according to claim 3, wherein the switching regulator is a step-down converter and the phase compensation quantity switching section reduces the phase compensation quantity corresponding to the conduction control signal which turns the switch device conductive.

5. The switching regulator control circuit according to claim 3, wherein the switching regulator is a boosting converter and the phase compensation quantity switching section reduces the phase compensation quantity corresponding to the conduction control signal which turns the switch device conductive.

6. The switching regulator control circuit according to claim 3, wherein the predetermined period is set up synchronously with the conduction control signal.

7. The switching regulator control circuit according to claim 3, wherein the predetermined period is started prior to a start of the conduction control signal.

8. The switching regulator control circuit according to claim 3, wherein the predetermined period is ended prior to an end of the conduction control signal.

9. The switching regulator control circuit according to claim 3, wherein ON/OFF of the switch device is performed in a predetermined cycle and the predetermined period is a period fixed since a timing in which conduction of the switch device is started in the predetermined cycle.

10. The switching regulator control circuit according to claim 1, wherein the phase compensation section is provided with plural capacitor devices connected in parallel and the phase compensation quantity switching section is provided on part of the plural capacitor devices.

11. The switching regulator control circuit according to claim 1 wherein the phase compensation section is provided with a capacitor device and a resistor device connected in series and the phase compensation quantity switching section bypasses the resistor device.

12. A switching regulator for controlling an output voltage by repeating supply of electric power corresponding to ON/OFF of a switch device, the switching regulator comprising:
   an error amplifier for amplifying a voltage difference between the output voltage and desired voltage; and
   a phase compensation section which is connected in between the input and output of the error amplifier so as to stabilize the operating condition of a control system,
   wherein the switching regulator further comprises a phase compensation quantity switching section for reducing the phase compensation quantity of the phase compensation section in a predetermined period containing a timing in which conduction of the switch device is started.

13. A switching regulator control method in which a voltage difference between an output voltage and desired voltage is amplified in terms of error and an output voltage is negatively fed back so as to stabilize the operating condition of the control system, the switching regulator control method comprising:
   A step of controlling the output voltage by repeating supply of electric power corresponding to ON/OFF of a switch device; and
   a step of reducing the phase compensation quantity of the phase compensation in a predetermined period containing a timing in which the conduction of the switch device is started.

* * * * *